US009459452B2

(12) United States Patent
Hada et al.

(10) Patent No.: US 9,459,452 B2
(45) Date of Patent: Oct. 4, 2016

(54) DISPLAY DEVICE WITH IMPROVED HEATING FOR OPERATING IN A LOW TEMPERATURE ENVIRONMENT

(71) Applicant: NIPPON SEIKI CO., LTD., Niigata (JP)

(72) Inventors: Makoto Hada, Niigata (JP); Shun Sekiya, Niigata (JP); Yasuhiro Yamakawa, Niigata (JP)

(73) Assignee: NIPPON SEIKI CO., LTD., Niigata (JP)

( * ) Notice: Subject to any disclaimer, the term of this patent is extended or adjusted under 35 U.S.C. 154(b) by 96 days.

(21) Appl. No.: 14/388,752

(22) PCT Filed: Mar. 7, 2013

(86) PCT No.: PCT/JP2013/056257
§ 371 (c)(1),
(2) Date: Sep. 26, 2014

(87) PCT Pub. No.: WO2013/146157
PCT Pub. Date: Oct. 3, 2013

(65) Prior Publication Data
US 2015/0092118 A1 Apr. 2, 2015

(30) Foreign Application Priority Data

Mar. 28, 2012 (JP) .................. 2012-072643
Jan. 16, 2013 (JP) .................. 2013-005312

(51) Int. Cl.
*G03B 21/16* (2006.01)
*H04N 9/31* (2006.01)
(Continued)

(52) U.S. Cl.
CPC ........... *G02B 27/0101* (2013.01); *B60K 35/00* (2013.01); *G02B 5/30* (2013.01);
(Continued)

(58) Field of Classification Search
CPC ............. H04N 9/3129; H04N 9/3132; H04N 9/3135; H04N 9/3144; G03B 21/2033; G03B 21/16
See application file for complete search history.

(56) References Cited

U.S. PATENT DOCUMENTS 7,586,971 B2 * 9/2009 Takeda .................. H04N 9/3161
372/100
7,817,689 B2 * 10/2010 Takeda ............... G03B 21/2033
372/22

(Continued)

FOREIGN PATENT DOCUMENTS

JP 1-237673 A 9/1989
JP 7-270711 A 10/1995

(Continued)

OTHER PUBLICATIONS

English translation, International Search Report PCT/JP2013/056257 dated Jun. 18, 2013.

*Primary Examiner* — Bao-Luan Le
(74) *Attorney, Agent, or Firm* — McDermott Will & Emery LLP

(57) ABSTRACT

Provided is a display device for a vehicle that can, in a configuration in which the cost of parts is curbed, quickly raise the temperature of a laser light source (LD) in a low temperature environment, and quickly perform stable image output. The LDs (11, 12, 13) emit laser light (RGB) and an MEMS mirror (30) scans the laser light (RGB) and generates a display image (M). A convex mirror (70) reflects display light (L) indicating the display image (M) in an external direction via a translucent light-transmitting unit (90). An LD driving means (101) emits laser light (RGB) to the LDs (11, 12, 13) when the temperature is low, and causes the LDs (11, 12, 13) to perform self-heating driving for raising the temperature of themselves.

10 Claims, 11 Drawing Sheets

(51) Int. Cl.
*G02B 27/01* (2006.01)
*G03B 21/20* (2006.01)
*B60K 35/00* (2006.01)
*G02B 26/08* (2006.01)
*G02B 26/10* (2006.01)
*G02B 5/30* (2006.01)
*G02B 27/10* (2006.01)
*H01S 5/024* (2006.01)
*H01S 5/068* (2006.01)
*H01S 5/40* (2006.01)

(52) U.S. Cl.
CPC ....... *G02B 26/0833* (2013.01); *G02B 26/105* (2013.01); *G02B 27/01* (2013.01); *G02B 27/0149* (2013.01); *G03B 21/16* (2013.01); *G03B 21/2033* (2013.01); *H01S 5/02453* (2013.01); *H04N 9/3129* (2013.01); *H04N 9/3144* (2013.01); *B60K 2350/2052* (2013.01); *G02B 27/1006* (2013.01); *H01S 5/02415* (2013.01); *H01S 5/06804* (2013.01); *H01S 5/4012* (2013.01); *H01S 5/4093* (2013.01)

(56) References Cited

U.S. PATENT DOCUMENTS

| | | | | |
|---|---|---|---|---|
| 8,960,914 B2 * | 2/2015 | Konno | ................. | G02B 27/286 349/194 |
| 9,172,209 B2 * | 10/2015 | Deng | ................... | H01S 5/02453 |
| 2003/0165306 A1 * | 9/2003 | Iida | ................... | G02B 6/12026 385/92 |
| 2004/0240495 A1 * | 12/2004 | Akamatsu | ............... | G03B 21/16 372/32 |
| 2008/0151949 A1 * | 6/2008 | Takeda | ................. | H04N 9/3161 372/22 |
| 2008/0267233 A1 * | 10/2008 | Deng | ................. | H01S 5/02453 372/34 |
| 2010/0302463 A1 * | 12/2010 | Matsumoto | ............ | G03B 21/16 348/744 |
| 2012/0057136 A1 * | 3/2012 | Enomoto | ............. | H04N 9/3144 353/61 |
| 2012/0057137 A1 * | 3/2012 | Enomoto | ............. | H04N 9/3141 353/61 |
| 2012/0134149 A1 * | 5/2012 | Enomoto | ............... | G03B 21/16 362/231 |
| 2012/0182487 A1 * | 7/2012 | Konno | ................. | G02B 27/286 349/7 |

FOREIGN PATENT DOCUMENTS

| | | | |
|---|---|---|---|
| JP | 2002341280 A | * | 11/2002 |
| JP | 2003-309318 A | | 10/2003 |
| JP | 2010-237238 A | | 10/2010 |
| JP | 2010237238 A | * | 10/2010 |
| JP | 2011-39325 A | | 2/2011 |

* cited by examiner

DISPLAY DEVICE WITH IMPROVED HEATING FOR OPERATING IN A LOW TEMPERATURE ENVIRONMENT

CROSS-REFERENCE TO RELATED APPLICATIONS

This application is the U.S. National Phase of PCT/JP2013/056257 filed Mar. 7, 2013, which claims priority from Japanese Patent Application No. 2012-072643 filed Mar. 28, 2012, and Japanese Patent Application No. 2013-005312 filed Jan. 16, 2013. The subject matter of each is incorporated herein by reference in entirety.

TECHNICAL FIELD

The present invention relates to a display device for a vehicle that is mounted on a vehicle and the like and displays vehicle information through a virtual image, specifically, to a display device for a vehicle using a laser diode as a light source.

BACKGROUND ART

In the related art, various display devices for a vehicle for projecting a display image on the semi-transmissive plate referred to as a windshield or a combiner of the vehicle and allowing a vehicle driver to see a virtual image have been proposed. These display devices for a vehicle are, for example, as shown in FIG. 9, disposed in a dashboard of the vehicle and allow a vehicle driver 3 to visually recognize the virtual image of a display image V and landscape by superimposing them by irradiating display light L to a windshield 2.

In the display device for a vehicle, a semiconductor laser (LD: Laser Diode) has been proposed as a light source and the device is, for example, disclosed in PTL 1. The display device for a vehicle includes LD as a light source, a screen, and a scanning system for generating a display image by allowing laser light to scan on the screen.

CITATION LIST

Patent Literature

[PTL 1] JP-A-7-270711

SUMMARY OF INVENTION

Technical Problem

However, an output characteristic of the LD of high power such as that used for the display device for a vehicle is lowered in a low temperature environment (for example, −40° C. to −10° C.) such as an environment in the vehicle. Thus, in the display device for a vehicle using the LD as the light source, there is room for improvement in terms of improving a display performance in the low temperature environment. Also, the LD can be warmed up to a normally operable temperature range using a thermoelectric element of a Peltier element, but several minutes are taken to raise the temperature and further time to reach the normally operable temperature is required. Furthermore, when providing a new thermoelectric element with high output such as a heater, there is a problem that cost is increased.

Therefore, the present invention is made in view of the problems described above and an object of the invention is to provide a display device for a vehicle that can quickly raise a temperature of a laser light source (LD) in a low temperature environment and quickly perform a stable image output in a configuration in which the cost of parts is curbed.

Solution to Problem

In order to solve the problems described above, a first invention is a display device for a vehicle including: a housing having a light-transmitting unit for transmitting light; a laser light source for emitting laser light; light source driving means for driving the laser light source; a scanning unit for generating an image by allowing the laser light to scan; scanning unit driving means for driving the scanning unit; and reflection means for reflecting display light indicating the image in a direction of the light-transmitting unit, in which the light source driving means emits the laser light to the laser light source and performs a self-heating drive to raise the temperature of the laser source. Thus, it is possible to quickly increase the temperature of the laser light source under a low temperature environment and it is possible to quickly perform the stable image output without increasing a new member such as a heater by such a configuration.

Further, in a second invention, the scanning unit driving means performs scanning when raising the temperature in which the laser light is allowed to scan by the scanning unit at a predetermined cycle while the laser light performs the self-heating drive. Thus, it is possible to prevent predetermined portions from burning due to the laser light by allowing the unnecessary laser light emitted from the laser light source to scan by the scanning unit when the self-heating drive is performed.

Further, in a third invention, the light source driving means performs the self-heating drive for raising the temperature of the laser light source by energizing direct current to the laser light source. Thus, the temperature of the laser light source can be quickly raised and the stable image output can be quickly performed by such a configuration.

Further, in a fourth invention, the display device for a vehicle further includes: temperature detection means for detecting the temperature of the laser light source, in which the light source driving means allows the laser light source to perform the self-heating drive when the detected temperature that is detected by the temperature detection means is lower than a first threshold that is determined in advance. Thus, it is possible to perform the self-heating drive in response to the temperature situation of the laser light source and it is possible to suppress the power consumption due to the unnecessary self-heating by such a configuration.

Further, in a fifth invention, the display device for a vehicle further includes: angle adjustment means for adjusting the reflection means to be at a desired angle, in which the angle adjustment means allows a position of the reflection means to be an invisible position in which the laser light is reflected into the housing while the laser light source performs the self-heating drive.

Further, in a sixth invention, the scanning unit driving means allows the laser light to scan, by the scanning unit, on a non-display area that is a region in which the image is not displayed in a scanning possible region by the scanning unit. Thus, it is possible to prevent the vehicle driver from being discomforted due to the unnecessary display image (laser light) by the fourth and fifth inventions.

Further, in a seventh invention, the display device for a vehicle further includes: auxiliary temperature raising means for raising the temperature of the laser light source, in which the auxiliary temperature raising means raises the temperature of the laser light source so that the detected temperature does not become a second threshold or less that is determined in advance. Thus, it is possible to suppress that the temperature of the laser light source is lowered to a temperature in which the output characteristics of the laser light source are lowered when the laser light source performs normal driving for outputting the display image not the self-heating drive and it is possible to continuously perform the stable image output even under the low temperature environment.

Further, in an eighth invention, the auxiliary temperature raising means is a Peltier element. Thus, it is possible to perform both auxiliary raising the temperature of the laser light source and the dispersion of the heat of the laser light source by a single element such as an Peltier element and it is possible to quickly raise the temperature of the laser light source under the low temperature environment and to quickly perform the stable image output without increasing a new member such as a heater and the like by such a configuration.

Further, in a ninth invention, the light source driving means gradually decreases driving power of the laser light source based on an increase in the detected temperature. Thus, it is possible to suppress an over current to the laser light source by increasing the temperature of the laser light source and it is possible to prevent the laser light source from being destroyed by such a configuration.

Further, in a tenth invention, the display device for a vehicle further includes: a laser-resistant member in a scanning possible range of the scanning unit, in which the scanning unit driving means irradiates the laser-resistant member with the laser light by the scanning unit while the laser light source performs the self-heating drive. Thus, it is possible to prevent predetermined portions from burning due to the laser light by such a configuration.

Advantageous Effects of Invention

The invention provides the display device for a vehicle in which the temperature of the laser light source (LD) can be quickly raised under the low temperature environment and stable image output can be quickly performed in a configuration in which the cost of parts is curbed.

DESCRIPTION OF EMBODIMENTS

Hereinafter, a configuration of an embodiment of a display device for a vehicle of the invention in which a head-up display device mounted on the vehicle is employed will be described with reference to the accompanying drawings. First, FIG. 1 is a side view of a head-up display device for vehicles 1 of the embodiment and FIG. 2 is an explanatory view of a combined laser light output unit 10 of the embodiment.

Figure 1:
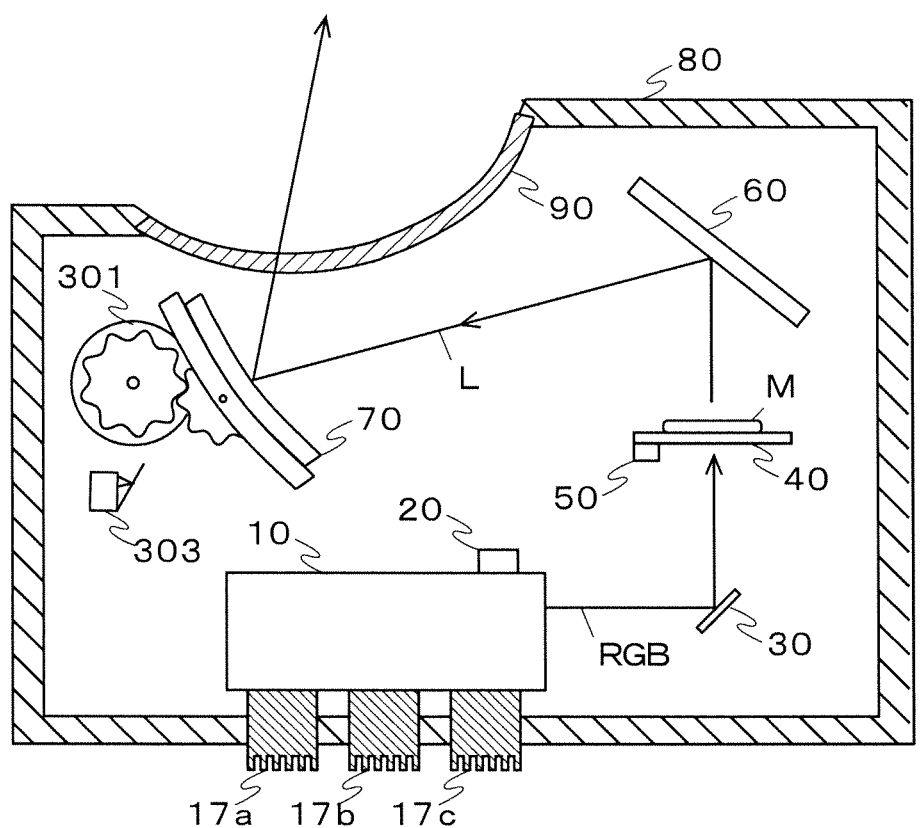
FIG. 1 is a cross-sectional view of a head-up display device for vehicles of one embodiment of the invention.

As shown in FIG. 1, the head-up display device for vehicles 1 includes the combined laser light output unit 10 for outputting combined laser light RGB, a color sensor (first light intensity detection means) 20 for receiving the combined laser light RGB and detecting a first light intensity that is a light intensity of each of the combined laser light RGB, a scanning unit 30 for allowing the combined laser light RGB to scan in a direction of a screen 40, the screen 40 onto which a display image M is projected by the light that is allowed to scan, a photo sensor (second light intensity detection means) 50 that is disposed on the screen 40 and detects a second light intensity that is the light intensity of the combined laser light RGB that is allowed to scan by the scanning unit 30, a plane mirror 60 that folds back display light L indicating the display image M that is projected onto the screen 40 to a concave mirror 70, the concave mirror 70 that emits the display light L to the windshield 2 via a light-transmitting unit 90 described below, a reflection means movement control unit 300 (angle adjusting means in the claims) that moves and rotates the concave mirror 70, a housing 80 that stores the combined laser light output unit 10, the color sensor 20, the scanning unit 30, the screen 40, the photo sensor 50, the plane mirror 60, the concave mirror 70, and the reflection means movement control unit 300, and the light-transmitting unit 90 that is disposed in apart of the housing 80. The display light L emitted from the head-up display device for vehicles 1 is reflected by the windshield 2 and is visually recognized as a virtual image V by a vehicle driver 3.

Figure 2:
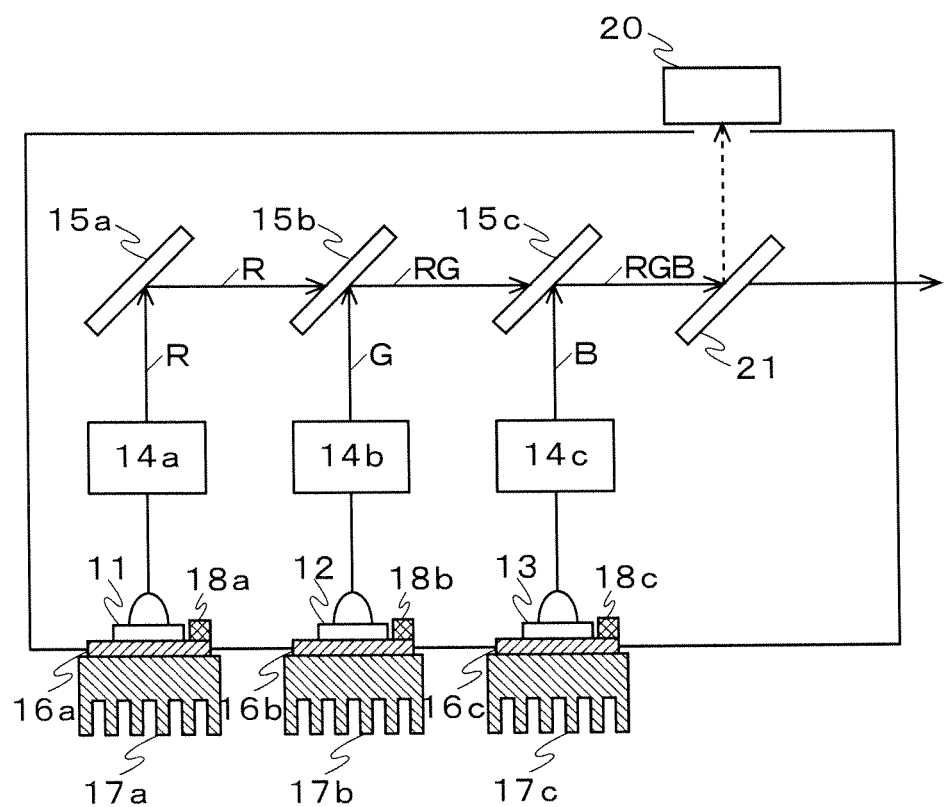
FIG. 2 is a cross-sectional view of a combined laser light output unit in the embodiment.

As shown in FIG. 2, the combined laser light output unit 10 is configured of laser diodes (laser light source in the claims) (hereinafter, referred to as LD: laser Diode) (LD following: Laser Diode) 11, 12, and 13, a condensing optical system 14, multiplexing means 15, a Peltier element (auxiliary temperature raising means in the claims) 16 that is connected to the LDs 11, 12, and 13 and cools the LDs 11, 12, and 13 or heats the LDs 11, 12, and 13 at low temperatures, a heat sink 17 that is connected to the Peltier element 16 and discharges the heat absorbed in the Peltier element 16 to the outside of the head-up display device for vehicles 1, and temperature detection means 18 that is disposed in the vicinity of LDs 11, 12, and 13, and detects the temperature of the LDs 11, 12, and 13. The combined laser light RGB that is output from the LDs 11, 12, and 13 is output as one combined laser light beam RGB by multiplexing.

The LDs (laser light source in the claims 11, 12, and 13 are configured of a red LD 11 for emitting red laser light R, a green LD 12 for emitting green laser light G, and a blue LD 13 for emitting blue laser light B. Light emission intensity and emission timing are adjusted independently based on the LD drive signal of the LD control unit 100 described below. Furthermore LDs 11, 12, and 13 are connected to the Peltier element 16 described below and performs heat dissipation or absorption via the Peltier element 16.

The condensing optical system 14 reduces the spot diameter of the combined laser light RGB and makes it a convergent light by using a lens, and includes a red light collecting unit 14a for collecting the red laser light R, a green light collecting unit 14b for collecting the green laser light G, and a blue light collecting unit 14c for collecting the blue laser light B.

The multiplexing means 15 is configured of a diachronic mirror that reflects light of a specific wavelength and transmits light of other wavelengths and the like. The multiplexing means 15 is configured by a first multiplexing unit 15a that reflects the red laser light R, second multiplexing means 15b that transmits the red laser light R and reflects the green laser light G, and third multiplexing means 15c that transmits the red laser light R and the green laser light G and reflects the blue laser light B.

The Peltier element (auxiliary temperature raising means in the claims 16) is a planar thermoelectric element using a Peltier effect. The Peltier element 16 is configured of a red Peltier element 16a that is connected to the red LD 11, a red Peltier element 16b that is connected to the green LD 12, and a blue Peltier element 16c that is connected to the blue LD 11. The heat is absorbed in one surface and is dissipated in the other surface by flowing a current and it is possible to reverse heat absorption and heat dissipation by reversing the flow of the current. In the embodiment, the Peltier element 16 is provided for each of the LDs 11, 12, and 13, but may be shared by a plurality of LDs.

The heat sink 17 has a fin shape so as to increase a surface area and is formed of a member having good thermal conductivity such as metal. The heat sink 17 is configured of a red heat sink 17a, a green heat sink 17b, and a blue heat sink 17c that are respectively connected to the red Peltier element 16a, the green Peltier element 16b, and the blue Peltier element 16c. Effects for cooling the Peltier element 16 and the LDs 11, 12, and 13 are obtained by disposing the other side thereof connected to the Peltier element 16 so as to protrude on the outside of the housing 80, absorbing the heat from the Peltier element 16, and dissipating the heat to the outside of the housing 80.

The temperature detection means 18 is a temperature sensor for detecting the temperatures of the LDs 11, 12, and 13, and is intended to output a detected temperature T, which is the detected temperatures of the LDs 11, 12, and 13, to the general control unit 400 as temperature data.

Further, the combined laser light output unit 10 includes a permeable membrane 21 disposed in the optical path of the combined laser light RGB and the color sensor 20 disposed in a reflecting direction of the combined laser light RGB by the permeable membrane 21.

The permeable membrane 21 is configured of a translucent member having a reflectivity of approximately 5%, transmits the combined laser light RGB, and reflects some of the combined laser light RGB in a direction of the color sensor 20.

The color sensor (first light intensity detection means) 20 receives some of the combined laser light RGB reflected from the permeable membrane 21, detects the first light intensity (red light intensity Ir of the red laser light R, green light intensity Ig of the green laser light G, and blue light intensity Ib of the blue laser light B) of the combined laser light RGB, and then outputs to the general control unit 400 described below via an A/D converter. Further, the first light intensity detection means 20 may be good as long as the light intensity is detected and thus, may be configured of photo diodes respectively provided at positions in which the red laser light R, the green laser light G, and the blue laser light B can be detected respectively other than the optical path of the combined laser light RGB.

The scanning unit 30 is a MEMS (Micro Electro Mechanical System) mirror and receives the combined laser light RGB from the combined laser light output unit 10, and generates the display image M on the screen 40 by allowing the combined laser light RGB to scan to the screen 40 based on the scanning unit control signal from the scan control unit 200 described below.

Figure 3:
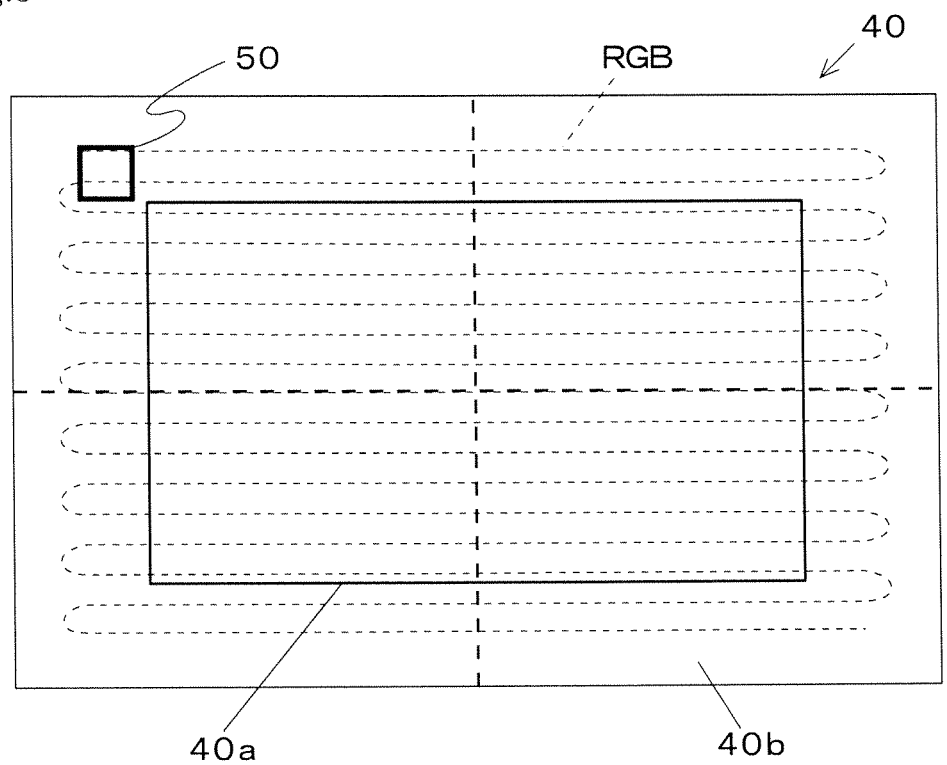
FIG. 3 is an explanatory view showing an aspect in which a display image is displayed on a screen by scanning in the embodiment.

The screen 40 receives the display image M from the MEMS mirror 30 from the back side thereof, transmits and diffuses the image, and then displays the display image M on the front side. For example, the screen 40 is configured of a holographic diffuser, a micro lens array, a polarizer or the like. As shown in FIG. 3, the screen 40 is classified into a display area 40a that is reflected by the plane mirror 60 and is viewed as the virtual image V to the vehicle driver 3, and a non-display area 40b that is not reflected by the plane mirror 60.

The photo diode (second light intensity detection means) 50 is disposed in a region of the non-display area 40b of the screen 40 on the side of the MEMS mirror 30 of the screen 40 and a region in which the MEMS mirror 30 is capable of scanning, and detects the light intensity of the combined laser light RGB that is allowed to scan by the MEMS mirror 30.

The photo diode 50 outputs the second light intensity that is the light intensity detected as an analog signal, converts the analog signal into a digital signal via an A/D converter, and outputs to the general control unit 400 described below.

A sampling frequency of the photo diode 50 and a modulation frequency of the LDs 11, 12, and 13 are synchronized with each other. The general control means 400 calculates a correction value of a positional deviation between a position of the display image M which is practically projected by the MEMS mirror 20 onto the screen 30 and a position of the target in which the display image M is to be projected from a detection timing of a second reference light intensity of the LDs 11, 12, and 13 which are recorded in the recording unit 402 in advance and a detection timing of the second light intensity detected in the photo diode 50, and outputs the correction value of the positional deviation to the general control unit 400 described below, the correction value is recorded in the recording means 402, and then positional deviation is corrected.

(Positional Deviation Correction Value Recording Means)

The plane mirror 60 is a plane mirror that folds back the display light L of the display image M projected in front surface of the screen 40 to the concave mirror 70 side.

The concave mirror 70 is a concave mirror that emits the display light L reflected from the plane mirror 60 via the light-transmitting unit 90 in the direction of the window mirror 2 of the vehicle.

In addition, in the concave mirror 70, a motor 301 for adjusting an angle is mounted and the reflection direction of the display light L can be adjusted by driving the motor 301 based on the reflection means control signal from the reflection means movement control unit 300 described below.

The housing 80 accommodates the combined laser light output unit 10, the color sensor 20, the MEMS mirror 30, the screen 40, the photo diode 50, the plane mirror 60, the concave mirror 70, and the like, and is formed of the light-shielding member. In addition, although the general control unit 400 for performing electrical control of the head-up display device for vehicles 1 described below may be disposed in the housing 80, or may be disposed outside of the head-up display device for vehicles 1 and electrically connected by wires.

The light-transmitting unit 90 is fitted in the housing 80 described below, is made of translucent resin such as acryl, and is formed in a curved shape so that external light from the outside of the head-up display device for vehicles 1 is not reflected in a direction of the vehicle driver 3.

Figure 4:
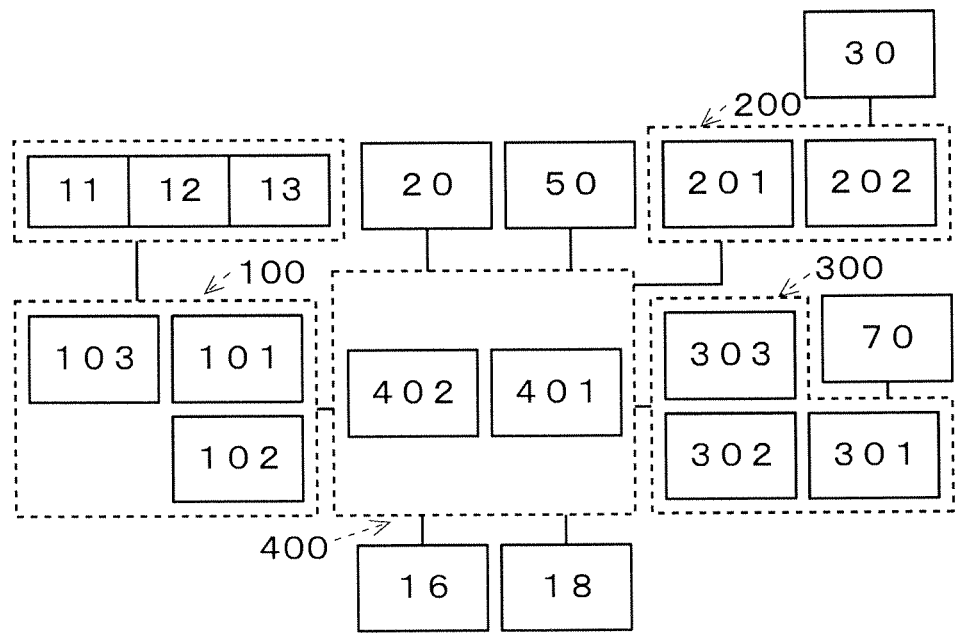
FIG. 4 is a configuration view of a head-up display device for vehicles in the embodiment.

The above is the configuration of the head-up display device for vehicles 1 in the embodiment and hereinafter, the description of the control of the head-up display device for vehicles 1 of the embodiment will be given with reference to FIG. 4.

The control configuration in the head-up display device for vehicles 1 includes an LD control unit 100 for driving the LDs 11, 12, and 13, a scan control unit 200 for driving the MEMS mirror 30, a reflection means movement control unit (angle adjusting means in the claims) 300 for driving a motor 301 attached to the concave mirror 70 and for moving and rotating the concave mirror 70, and the general control unit 400 for controlling the LID control unit 100, the scan control unit 200, and the reflection means movement control unit 300.

The LID control unit 100 includes LID driving means (light source driving means in the claims) 101 formed of an LID driver circuit for lighting the red LID 11, the green LID 12, and the blue LD 13, LID current detection means 102, and LD power supply means 103 formed of a power supply circuit supplying power to the LDs 11, 12, and 13. The LID power supply means 103 may be provided independently with respect to the red LD 11, the green LD 12, the blue LID 13, respectively or may be shared with a plurality of LDs.

The LD driving means (light source driving means in the claims) 101 inputs LID control data output from the general control unit 400 described below and allows each of the LDs 11, 12, and 13 to be PWM (Pulse Width Modulation) control, PAM (Pulse Amplitude Modulation) control, or DC (Direct Current) control based on the LID control data. The LID control data is classified as normal LD control data that drives each of the LDs 11, 12, and 13 in order to display a desired display image M and self-heating LID control data that causes the LDs 11, 12, and 13 to perform the self-heating drive under a low temperature environment and heats LDs 11, 12, and 13 themselves to be warm. The LID control means 101 DC-controls the LDs 11, 12, and 13 in the self-heating drive. As described above, By DC-controlling the LDs 11, 12, and 13 in this manner, more current can be flowed by the LDs 11, 12, and 13, thereby quickly raising the temperature of the LID.

The LID current detection means 102 detects a current value flowing through the red LID 11, the green LID 12, and the blue LD 13, respectively, and outputs the LID current data indicating the current value to the LID driving means 101. The LD current detection means 102 always detects the current value flowing through the LDs 11, 12, and 13, but may detect only in a predetermined operation of the head-up display device for vehicles 1, or may detect for each predetermined period.

Then, the scan control unit 200 will be described.

The scan control unit 200 includes MEMS mirror driving means 201 for driving the MEMS mirror 30 and mirror position detection means 202 for detecting a position of the MEMS mirror 30.

The MEMS mirror driving means 201 is configured of a drive circuit of the MEMS mirror 30 and as shown in FIG. 3, allows the combined laser light RGB to scan by vertical driving and horizontal driving of the MEMS mirror 30, based on the MEMS mirror control data from the general control unit 400.

The MEMS mirror driving means 201 inputs the scanning position detection data that is output from the mirror position detection means 202 and calculates feedback data from the scanning position detection data, and outputs the feedback data to the general control unit 400 after driving MEMS mirror 30.

The feedback data output from the MEMS mirror driving means 201 is data such as an actually measured resonance frequency that is the resonance frequency of the piezoelectric element when moving the mirror of the MEMS mirror 30 actually horizontally, an actually measured vertical driving frequency that is a horizontal frequency of the piezoelectric element when moving the mirror actually horizontally, and the like.

The mirror position detection means 202 detects a position of the vibration for each time for the piezoelectric element moving the mirror of the MEMS mirror 30 and outputs the position to the MEMS mirror driving means 201 as scanning position detection data.

Then, the reflection means movement control unit 300 will be described.

The reflection means movement control unit 300 includes a motor 301 for adjusting the angle of the concave mirror 70, a motor drive unit 302 for driving the motor 301, and a concave mirror state detection unit 303 for detecting the angle of the concave mirror 70. The motor drive unit 302 drives the motor 301 and adjusts the concave mirror 70 at a desired angle based on the angle adjustment data from the general control unit 400.

The motor 301 is configured of an actuator such as a stepping motor for adjusting the angle of the concave mirror 70 based on a drive signal from the motor drive unit 302.

An angle region in which the motor 301 can adjust the concave mirror 70 is classified as a visible position in which the concave mirror 70 irradiates the display light L from the light-transmitting unit 90 to the outside and an invisible position in which the concave mirror 70 does not irradiate the display light L from the light-transmitting unit 90 to the outside.

Figure 5:
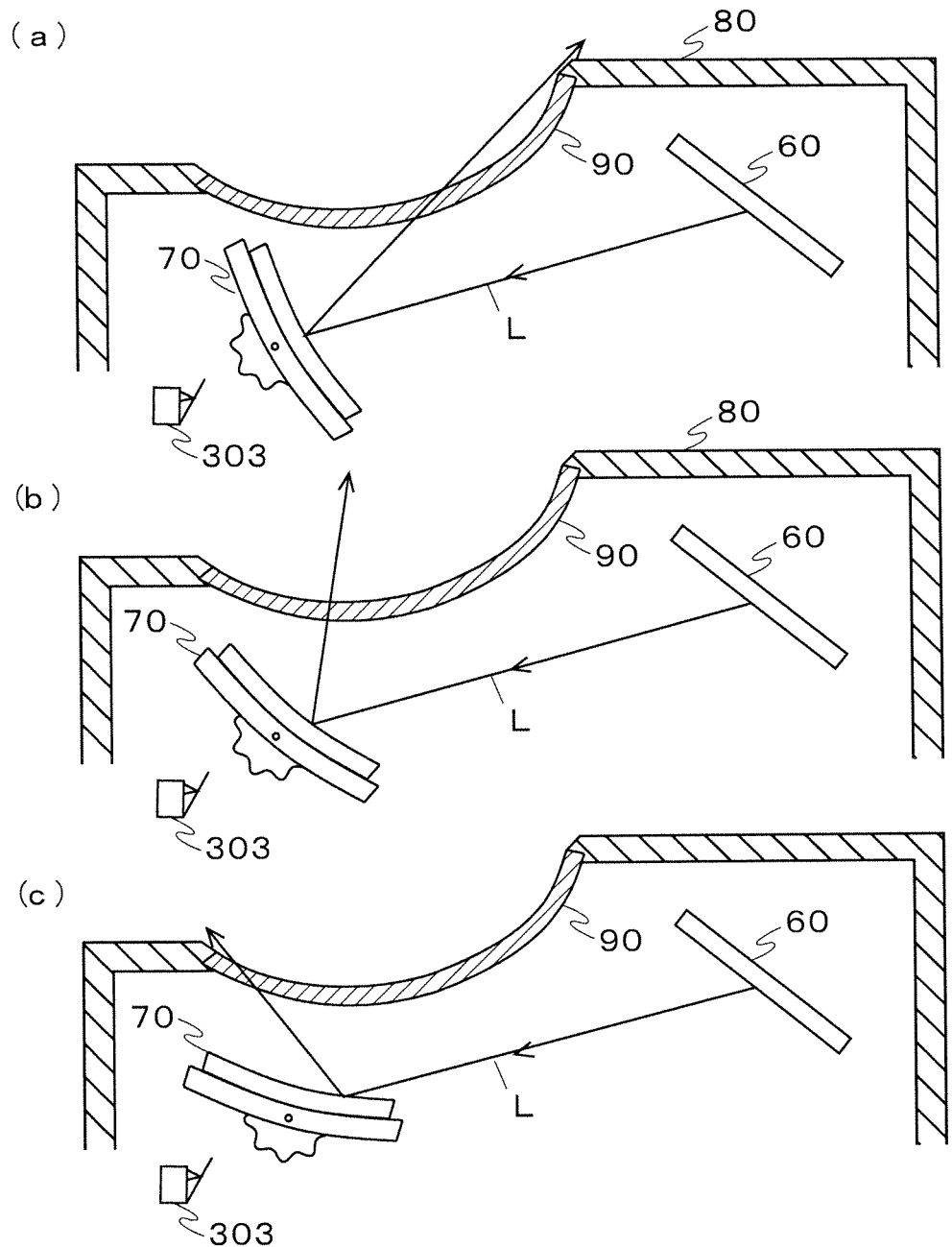
FIG. 5 is an explanatory view describing a visible position of a concave mirror in the embodiment.

The visible position is an angular position of the concave mirror 70 in the normal driving of the head-up display device for vehicles 1 of the embodiment, as shown in FIG. 5 (*b*), or is an angular position in which the concave mirror 70 irradiates the display light L from the light-transmitting unit 90 to the outside as shown in FIGS. 5 (*a*) and (*c*).

Further, in the visible position, it is possible to adjust a position (position in which the virtual image V is visible) in which the display light L is projected onto the windshield 2 by adjusting the angle of the concave mirror 70 by the operation of a push button switch (not shown) that is mounted on the vehicle.

Figure 6:
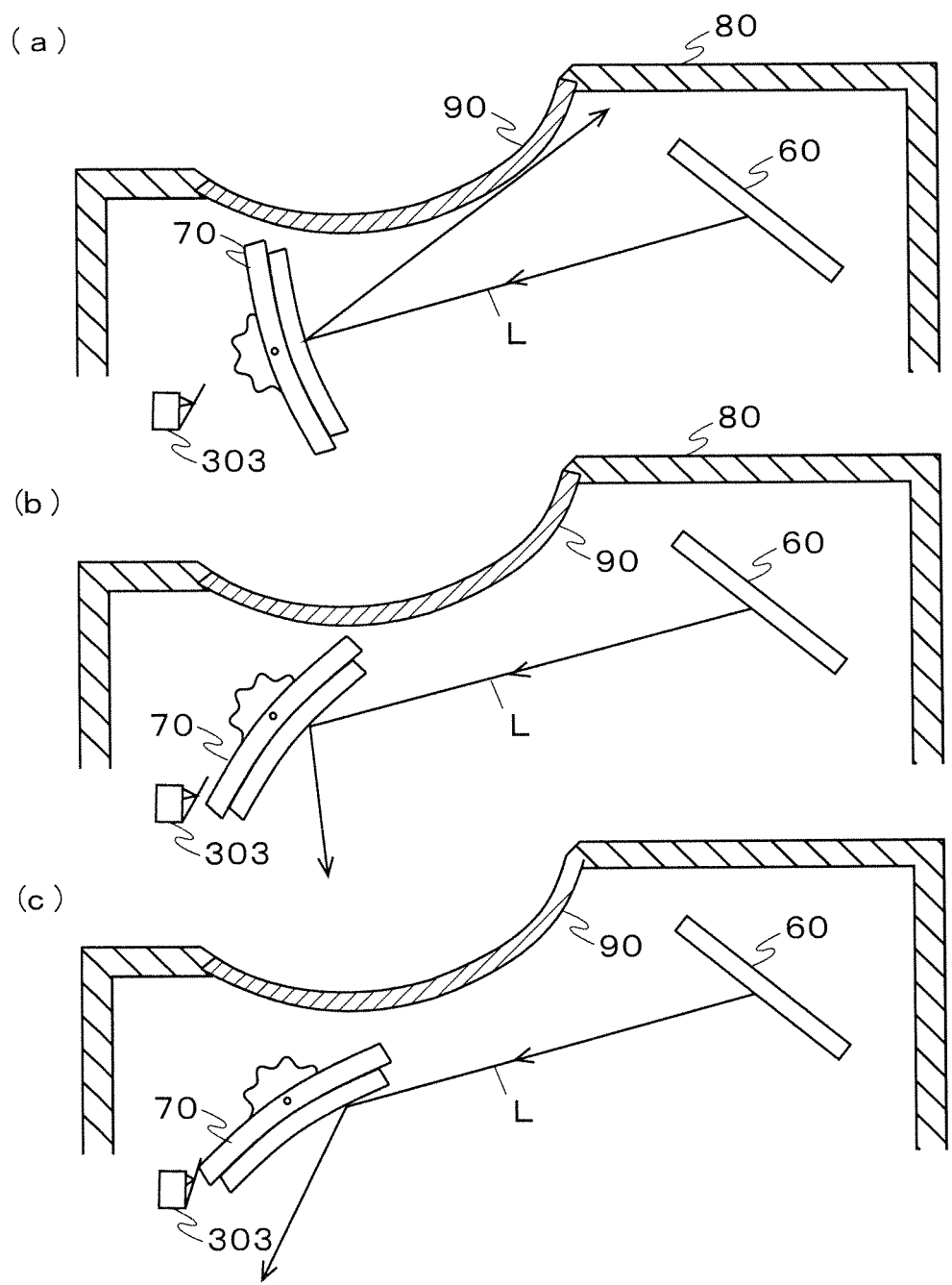
FIG. 6 is an explanatory view describing an invisible position of the concave mirror in the embodiment.

As shown in FIG. 6, when causing the LDs 11, 12, and 13 of the head-up display device for vehicles 1 of the embodiment to perform the self-heating drive, the invisible position is the angular position of the concave mirror 70 where the unnecessary display light L is not emitted from the light-transmitting unit 90.

In the head-up display device for vehicles 1 of the embodiment, the motor 301 is shown as a common motor to adjust the angle of the concave mirror 70 to the invisible position and the visible position, and to adjust the position in which the display light L is projected onto the windshield 2 in the visible position, but may be provided separately.

Further, in the embodiment, the motor 301 is intended to adjust the angle of the concave mirror 70, but it is possible to move the concave mirror 70 to the visible position and the invisible position.

The motor drive unit 302 is a driver circuit of a stepping motor and drives the motor 301 based on the angle adjustment data output from the general control unit 400.

The angular adjustment data is data for adjusting the angle relative to the predetermined original point of the concave mirror 70 described below and is recorded in advance in the recording means 402.

As shown in FIG. 6 (*c*), the concave mirror state detection unit 303 is a mechanical switch for detecting whether the concave mirror 70 is in the original point and detects the contact and depression with one point of the concave mirror 70, and outputs the origin detection signal to the general control unit 400.

Further, in the embodiment, the concave mirror state detection unit 303 detects only whether the concave mirror 70 is in the original point, but may perform the angle detection of the concave mirror 70 by using an angle sensor.

Then, the general control unit 400 will be described. The general control unit 400 is configured of a CPU 401 that is formed of a microcomputer, a FPGA (Field•Programmable•Gate•Array), an ASIC, and the like, and recording means 402 that is formed of EEPROM, Flash, and the like, and records programs and data that drive the CPU 401. The general control unit 400 controls the LD control unit 100, the scan control unit 200, and the reflection means movement control unit 300.

The general control unit 400 inputs, from the vehicle ECU (not shown), LD current data indicating vehicle information, a start signal, or the current value flowing through the LDs 11, 12, and 13, temperature data indicating the detected temperature T of the LDs 11, 12, and 13 from the temperature detection unit 18, first light intensity data from the first light intensity detection means 20, second light intensity data from the second light intensity detection means 50, and feedback data from the scan control unit 200, and an origin detection signal indicating that the concave mirror 70 from the reflection means movement control unit 300 is in the origin position. The general control unit 400 generates and outputs LD drive data (normal LD control data, self-heating LD control data) for driving the LID control unit 100, scanning unit control data for driving the scan control unit 200, and an angle adjustment data for driving the reflection means movement control unit 300 from the above information, and overall controls the head-up display device for vehicles 1 of the embodiment.

The control configuration of the head-up display device for vehicles 1 of the embodiment is described above, and the operation step of the head-up display device for vehicles 1 according to the embodiment will now be described with reference to FIG. 7.

(Self-Heating Drive)

Figure 7:
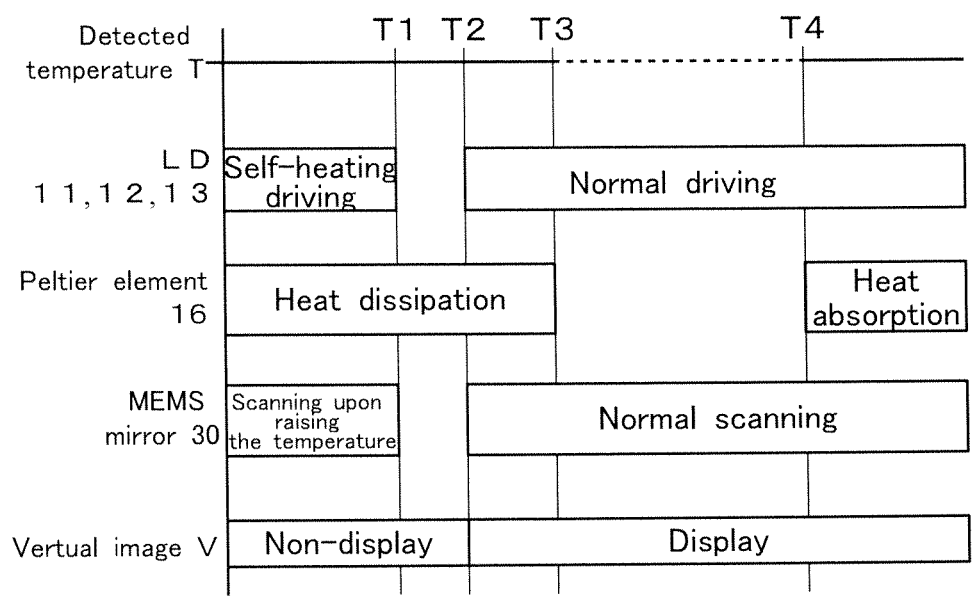
FIG. 7 is an explanatory view describing an operation of the head-up display device for vehicles in each temperature region in the embodiment.

FIG. 7 is a view for describing how warm the combined laser light output unit 10 (LDs 11, 12, and 13) is based on the detected temperature T detected from the temperature detection means 18. The CPU 401 outputs the self-heating LD control data with respect to the LD driving means 101 when the detected temperature T that is detected by the temperature detection means 18 is lower than a first threshold value T1 (−10° C.) that is recorded in the recording unit 402 in advance, and the LD driving means 101 causes the LDs 11, 12, and 13 to perform the self-heating drive. The self-heating drive performs self-heating by flowing a DC current in the LDs 11, 12, and 13. Therefore, as described above, it is possible to further quickly increase the temperature of the laser light source by driving the laser light source by the DC current. The magnitude of the current value is larger, it is possible to quickly increase the temperature, but the laser light source is driven at a current less than a current value in which the laser light source is destroyed and the currents flowing in the self-heating drive may be adjusted from the temperature or the current value that is actually flowed. The LD drive means 101 gradually reduces drive power of the LDs 11, 12, and 13 with increasing temperature of the LDs 11, 12, and 13 (for example, low current driving). The driving power is reduced and an excessive current to the laser light source due to the temperature rise of the laser light source is suppressed, and it is possible to prevent laser light source from being destroyed, based on the temperature rise in this way. Further, as described above, when the LDs 11, 12, and 13 are caused to perform the self-heating drive, thereby the CPU 401 heats a surface that is connected to the LDs 11, 12, and 13 by applying a current to the Peltier element 16 and assists in raising the temperature of the LDs 11, 12, and 13.

Further, when the detected temperature T is between the first threshold value T1 (−10° C.) that is recorded in the recording unit 402 in advance and a third threshold value T3 (10° C.), the CPU 401 stops the self-heating drive of the LDs 11, 12, and 13, and raises the temperature of the LDs 11, 12, and 13 only with the Peltier element 16.

Further, when the detected temperature T is higher than the third threshold value T3 (10° C.) that is recorded in the recording unit 402 in advance, the CPU 401 does not perform the temperature rise due to the self-heating of the LDs 11, 12, and 13, or the temperature rise by the heating of the Peltier element 16.

Also, when the detected temperature T is higher than the second threshold value T2 that is a temperature higher than the first threshold value T1 stored in the recording unit 402 in advance, the CPU 401 normally drives the LDs 11, 12, and 13 via the LD control unit 100, and allows the MEMS mirror 30 to perform normally scanning via the scan unit 200, whereby the display image M is displayed on the screen 40.

Thus, it is possible to prevent switching between the self-heating drive and the normal driving of the LDs 11, 12, and 13 with the LD control means 101 from being frequently performed by separately providing the first threshold value T1 that is a threshold of whether to perform or stop the self-heating drive of the LDs 11, 12, and 13, and the second threshold value T2 that is a threshold of whether to perform the normal driving to display the display image M (providing a temperature difference).

Further, when the detected temperature T exceeds a fourth threshold value T4, the CPU 401 allows the current to flow in opposite to the current applied to the Peltier element 16 when heating, the heat of the LDs 11, 12, and 13 to be absorbed, and the heat to be dissipated through the heat sink 17. When the temperature of the laser light source rises, an oscillation threshold current value that is applied for laser oscillation is increased and the laser oscillation is not generated if a large amount of current is not applied. Therefore, the Peltier element 16 is controlled so that the temperature of the LDs 11, 12, and 13 is a temperature or more for stabilizing the output characteristics and heat absorption or heat dissipation are performed so as to lower the temperature as possible.

The MEMS mirror 30 performs scanning when raising the temperature which allows the combined laser light RGB at a predetermined cycle to scan during the self-heating drive of the LDs 11, 12, and 13 (scanning unit driving means in the claims). As shown in FIG. 3, the scanning when raising the temperature is a normal scanning that performs the horizontal scanning drive and the vertical scanning drive at a period that is similar when the LDs 11, 12, and 13 are normally driven, and the display light L generated by the normal scanning is not reflected toward the light-transmitting unit 90 by positioning the concave mirror 70 in the invisible position, and is not visually recognized by the vehicle driver 3. In this manner, it is possible to prevent the MEMS mirror 30 or the screen 40 from being destroyed due to the combined laser light. RGB having high light intensity by the self-heating drive, by causing the MEMS mirror 30 to perform scanning at a predetermined cycle.

Further, since the scanning when raising the temperature may change the scanning position of the display light L to an extent that the screen 40 is not burned due to unnecessary display light L during self-heating drive of the LDs 11, 12, and 13, it is not necessary to scan always and the scanning unit 30 may repeatedly stop and perform the scanning at a predetermined cycle to the extent that the screen 40 is not burned.

Second Embodiment

In the above embodiment, the unnecessary display light L during the self-heating is not emitted to the outside by making the concave mirror 70 to be in the invisible position, but in a second embodiment of the invention, the concave mirror 70 is not necessary to be in the invisible position, as shown in FIG. 8(a), the LD driving means 101 causes the LDs 11, 12, and 13 to perform the self-heating drive at only timing in which the MEMS mirror 70 scans the non-display area 40b during the self-heating drive of the LDs 11, 12, and 13, and does not drive the LD in the display area 40a. Thus, unnecessary display light L may be prevented from being emitted to the outside.

Third Embodiment

Further, in the third embodiment of the invention, as shown in FIG. 8(b), the MEMS mirror driving means 201 allows the MEMS mirror 70 to perform scanning only by the non-display area 40b while the LDs 11, 12, and 13 perform the self-heating drive, it is possible to prevent unnecessary display light L from being emitted to the outside in such a configuration similar to the embodiment described above.

Figure 8:
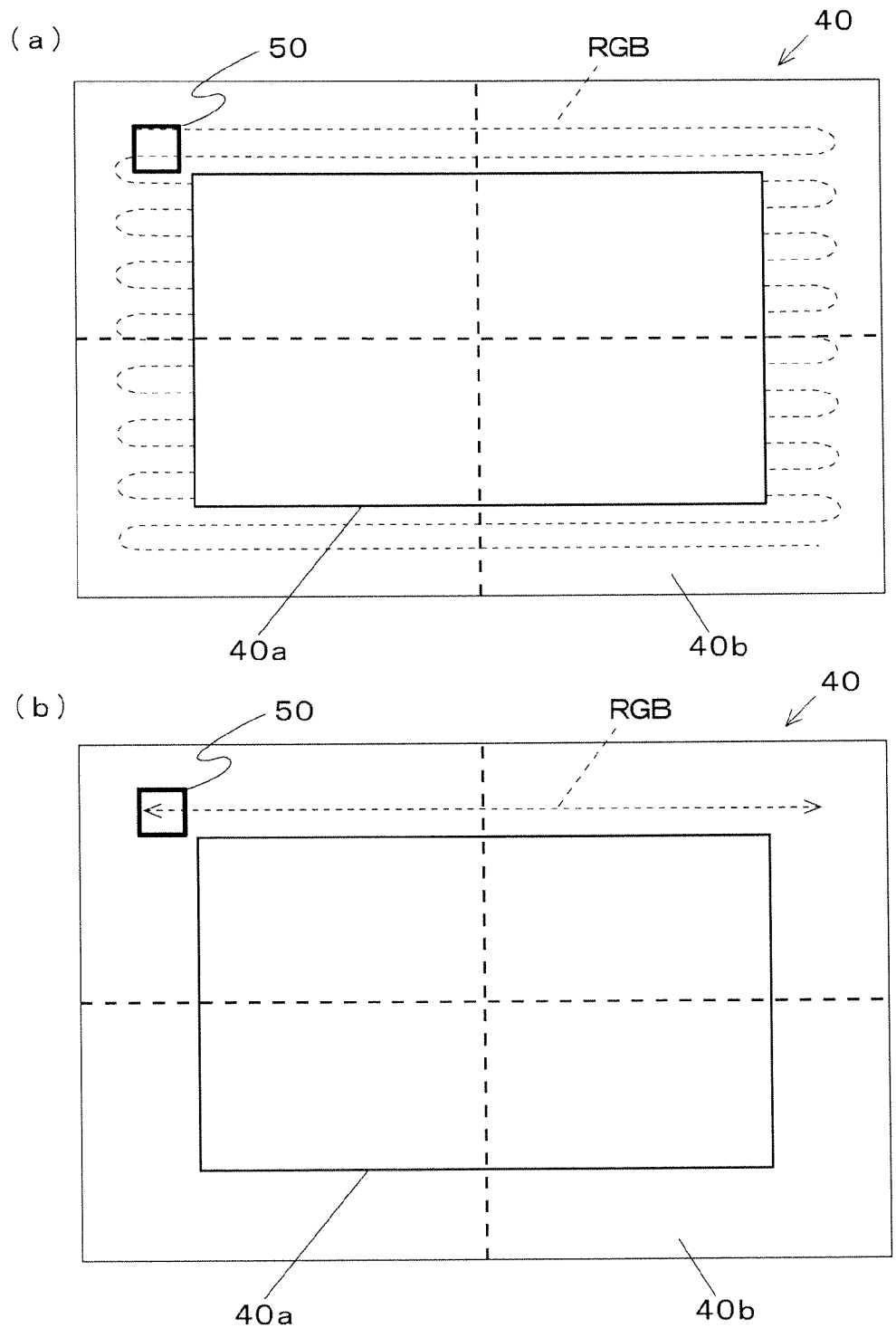
FIG. 8 is an explanatory view describing an aspect in which a MEMS mirror allows the laser light to scan on the screen in a modification example of a head-up display device for vehicles of the invention, FIG. 8(*a*) is a view describing an aspect in which LD is turned off only while a display area is scanned in horizontal and vertical scanning of the MEMS mirror (second embodiment), and FIG. 8 (*b*) is a view describing an aspect in which a scanning range of the MEMS mirror is set to only a non-display area by turning off the LD (third embodiment).
Figure 9:
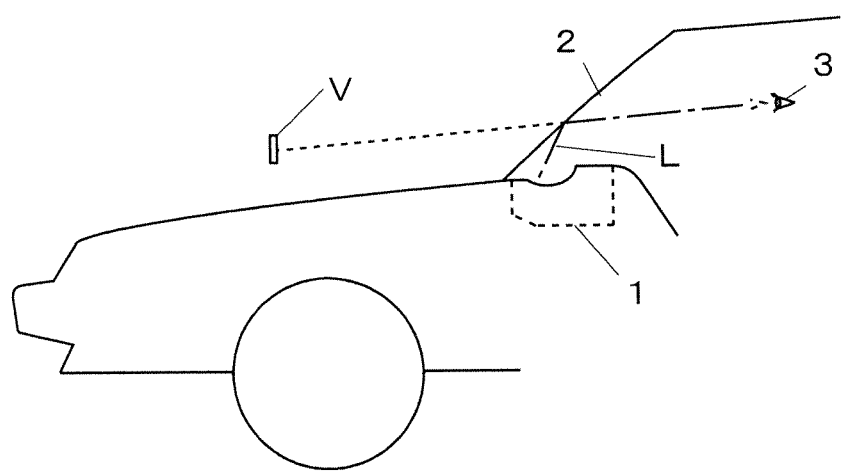
FIG. 9 is a schematic view of the head-up display device for vehicles in the embodiment of the invention.

In the embodiment described above, at the time of starting the head-up display device for vehicles 1, as shown in FIG. 3 and FIG. 8, the combined laser light RGB when the LDs 11, 12, and 13 perform the self-heating drive is subjected to the scanning when raising the temperature on the screen 40 by the MEMS mirror 70. Thus, it is possible to prevent burning of the screen 40. However, when starting the head-up display device for vehicles 1, the MEMS mirror 70 does not operate normally and the combined laser light RGB is locally irradiated in a part of the screen 40 when the LDs 11, 12, and 13 perform the self-heating drive, and there is a concern that the screen 40 is burned. However, according to a fourth embodiment described below, it is possible to prevent the burning of the screen 40 by attenuating the laser light irradiated to the MEMS mirror 70 with the attenuation element 22 until the MEMS mirror 70 is normally started. Hereinafter, the fourth embodiment of the invention will be described with reference to FIGS. 10 to 15.

Fourth Embodiment

Figure 10:
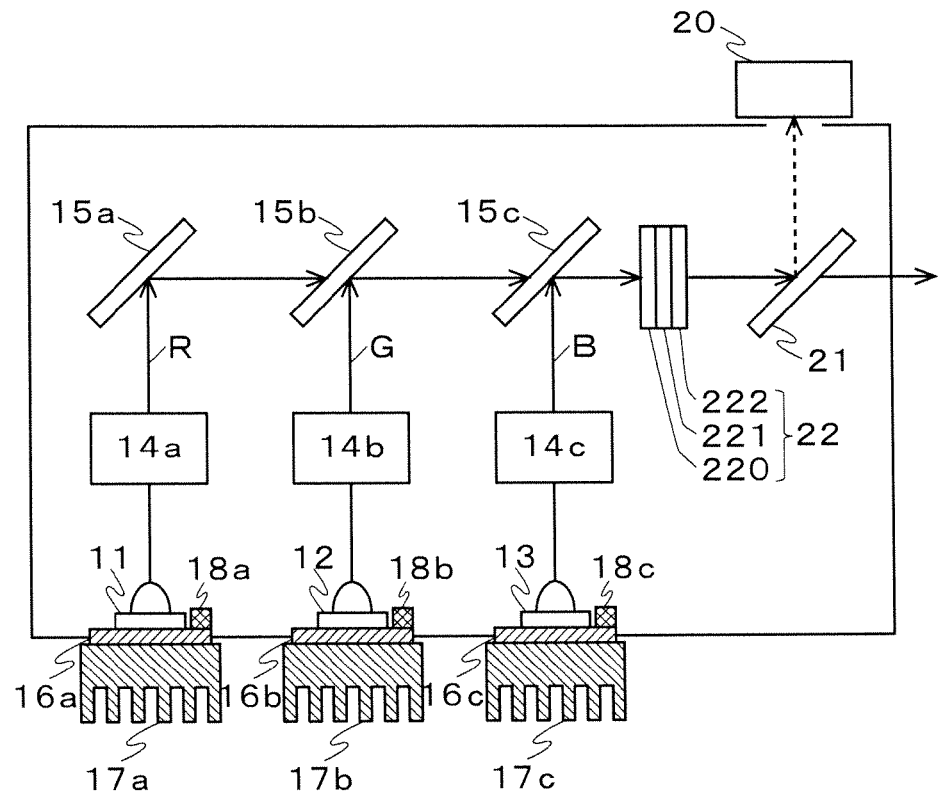
FIG. 10 is a cross-sectional view of a combined laser light output unit in a fourth embodiment of the invention.
Figure 11:
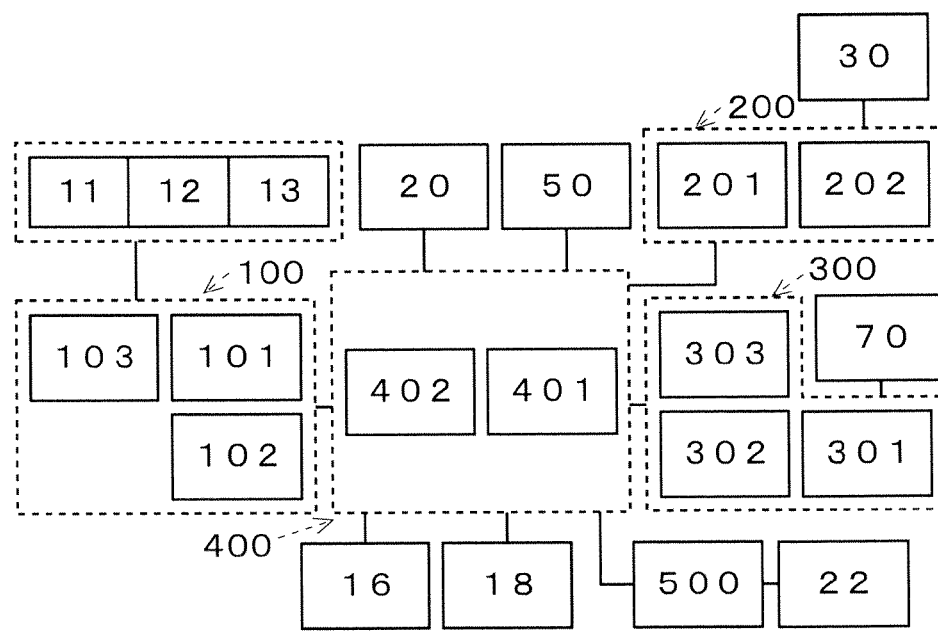
FIG. 11 is a configuration view of the head-up display device for vehicles in the embodiment.

As shown in FIG. 10, the fourth embodiment of the invention includes the attenuation element (attenuating unit) 22 that adjusts the transmittance (attenuating rate P) of the combined laser light RGB, on the optical path of the combined laser light RGB, and an attenuation element control unit (attenuation unit control means) 500 (see FIG. 11) that is configured of a drive circuit that controls the attenuating rate P of the attenuation element 22.

The attenuation element (attenuation unit) 22 includes a pre-polarizing filter 220, a liquid crystal element 221, and a post-polarizing filter 222, and can prevent burning of the screen 40 by attenuating the laser light beams R, G, and B immediately after the start switch ON described below.

The pre-polarizing filter 220 and the post-polarizing filter 222 are configured of a polarizing element that is durable in the laser light such as aluminum wire grid polarizing filter.

The liquid crystal element 221 is configured of a liquid crystal element of a VA type (Vertical Alignment type) that is normally black mode where the transmittance is minimum (maximum attenuating rate Pm) during no voltage and adjusts the attenuating rate P based on the control signal from the attenuation element control unit 500. The liquid crystal element 221 is configured of the VA type, but may be configured of a reflection type, a transmission type LSOS (Liquid Crystal On Silicon) and the like.

Further, since it is sufficient that the attenuation element 22 can attenuate the laser light of the LDs 11, 12, and 13, it may be provided in each of the red laser light R, the green laser light G, and the blue laser light B rather than the optical path of the combined laser light RGB. Further, since the laser light is always irradiated on one point, for the attenuation element 22, it is preferable that a member having heat resistance or light resistance be used and it is preferable that each of them be connected to a heat dissipation member. Moreover, the attenuation element 22 is configured of the polarizing filter and the liquid crystal element, but, for example, may be configured of a variable concentration type ND filter as long as the laser light is attenuated.

The attenuation element control unit (attenuation unit control means) 500 is configured of a VA liquid crystal voltage variable pulse waveform generating circuit composed of oscillation, integration, and amplifier circuits that adjust the polarization angle of the liquid crystal element 221. Attenuation element control unit 500 generates a liquid crystal driving pulse waveform of voltage of approximately 0 to ±20V from brightness adjustment data (PWM signal) that is electrically connected to the general control unit 400 and is input from the general control unit 400. The attenuation element control unit 500 adjusts the polarization angle of the laser light by the liquid crystal element 221 from a voltage width of the liquid crystal driving pulse waveform and adjusts the attenuation amount P of the laser light by a difference from the transmission polarization angle of the post-polarizing filter 222.

Further, the general control unit 400 in the fourth embodiment inputs, from the vehicle ECU (not shown), the display brightness information and the start signal, the LD current data indicating the current value flowing through the LDs 11, 12, and 13, the temperature data indicating the detected temperature T of the LDs 11, 12, and 13 from the temperature detection means 18, the first light intensity data from the first light intensity detection means 20, the second light intensity data from the second light intensity detection means 50, the feedback data from the scan control unit 200, and the origin detection signal indicating that the concave mirror 70 from the reflecting means movement control unit 300 is in the original position. The general control unit 400 generates the brightness adjustment data for driving the attenuation element control unit 500 from the above information and adjusts the attenuation amount P of the laser light by the liquid crystal element 221 via the attenuation element control unit 500.

The control configuration of the head-up display device for vehicles 1 of the fourth embodiment is described above and the operation step of the head-up display device for vehicles 1 according to the fourth embodiment will be described with reference to FIGS. 12 to 15.

(Self-Heating Drive)

Figure 12:
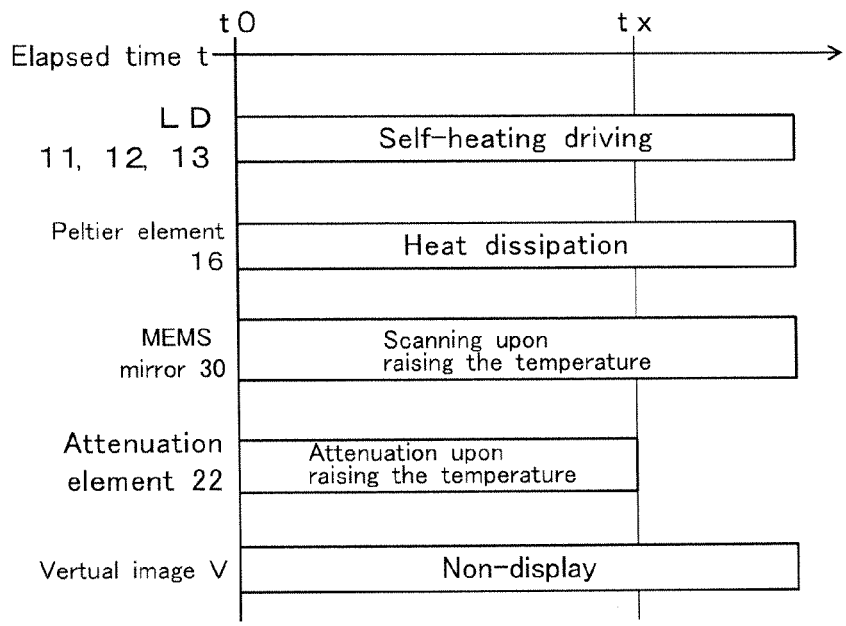
FIG. 12 is an explanatory view describing a time course of an operation of the head-up display device for vehicles in the embodiment.

FIG. 12 is a view describing the time course of the LDs 11, 12, and 13, the Peltier element 16, the MEMS mirror 30, and the attenuation element 22 when the start time is t0 in the head-up display device for vehicles 1. In the time t0, when the detected temperature T detected by the temperature detection means 18 is lower than the first threshold value T1 (−10° C.) that is recorded in the recording unit 402 in advance, CPU 401 outputs the self-heating LD control data with respect to the LD driving means 101 and the LD driving means 101 causes the LDs 11, 12, and 13 to perform the self-heating drive. The self-heating drive performs self-heating by flowing a DC current in the LDs 11, 12, and 13. Further, when the LDs 11, 12, and 13 perform the self-heating drive, the CPU 401 heats the surface that is connected to the LDs 11, 12, and 13 by applying the current to the Peltier element 16, and assists in raising the temperature of the LDs 11, 12, and 13.

Further, the MEMS mirror 30 performs the scanning when raising the temperature that allows the combined laser light RGB to scan to the screen 40 at a predetermined cycle while the LDs 11, 12, and 13 perform self-heating drive. However, as described above, since it takes time until the MEMS mirror 30 performs stable scanning at the starting, the attenuation element 22 performs the attenuation when raising the temperature that attenuates the combined laser light RGB during this time.

Figure 13:
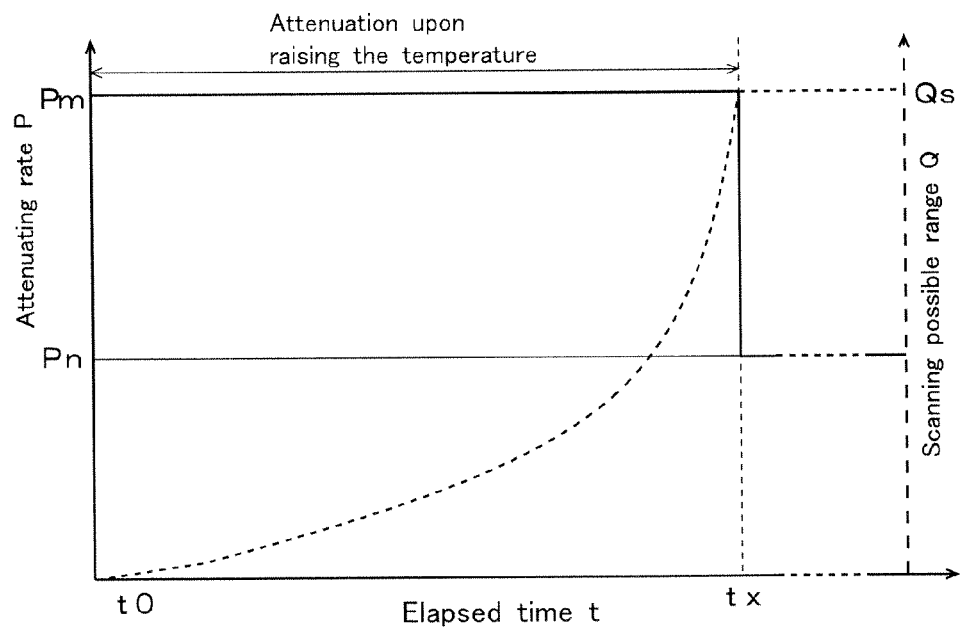
FIG. 13 is a view describing the time course of an attenuation rate P of an attenuation element and a scanning possible range Q of the MEMS mirror in the embodiment.

FIG. 13 is a view showing a time course (solid line in FIG. 13) of the attenuating rate P of the attenuation element 22 with respect to an elapsed time t and a time course (dotted line in FIG. 13) of the scanning possible range Q of the MEMS mirror 70 with respect to the elapsed time t. The scanning possible range Q of the MEMS mirror 70 gradually increases from the time of starting (time t0) and the scanning can be performed by a range in the normal scanning at time tx. At this time, first, the MEMS mirror 70 can perform the horizontal scanning drive, and then can gradually perform the vertical scanning drive in an extensive range. As a result, the scanning possible range Q of the MEMS mirror 70 is widened. The screen 40 is likely to be burned as the scanning possible range Q of the MEMS mirror 70 is narrowed and the screen 40 is unlikely to be burned as the scanning possible range Q is widened.

The general control unit 400 sends the brightness adjustment data of the maximum attenuating rate Pm to the attenuation element control unit 500 after the start switch is turned ON (time t0). Since the attenuation element 22 has characteristics of normally black, the brightness adjustment data of the maximum attenuating rate Pm is no voltage pulse waveform. Then, after the general control unit 400 determines that the MEMS mirror 70 becomes stable scanning (tx) by the feedback data from the scan control unit 200, the general control unit 400 sends arbitrary (request) brightness adjustment data Pn to the attenuation element control unit 500 based on the brightness information from the vehicle ECU and controls the attenuation element 22 (see FIG. 13). Thus, since the liquid crystal element 22 is the normally black mode, it is possible to reliably attenuate the laser light immediately after the starting. The determination whether or not the MEMS mirror 70 performs stable scanning is not determined by the feedback data from the scan control unit 200 as described above, and a time tx expected until the stable scanning is performed is stored in the memory in advance and the attenuation when raising the temperature may be performed in the attenuation element 22 until a predetermined time (tx) is elapsed.

Figure 14:
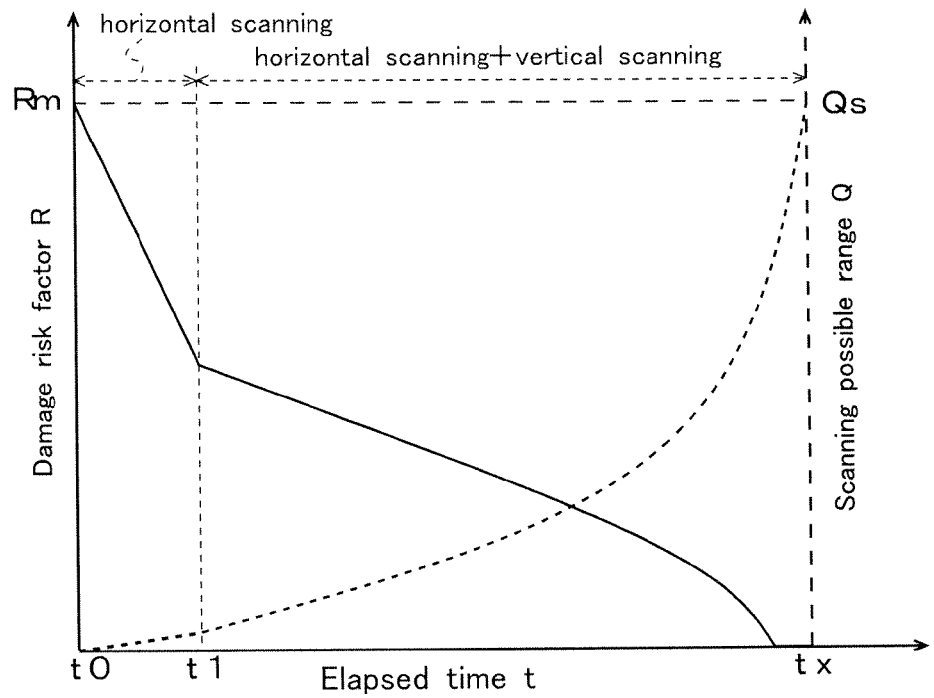
FIG. 14 is a view describing a relationship between a damage risk factor R associated with burn-in of the screen and the scanning possible range Q of the MEMS mirror in the embodiment.
Figure 15:
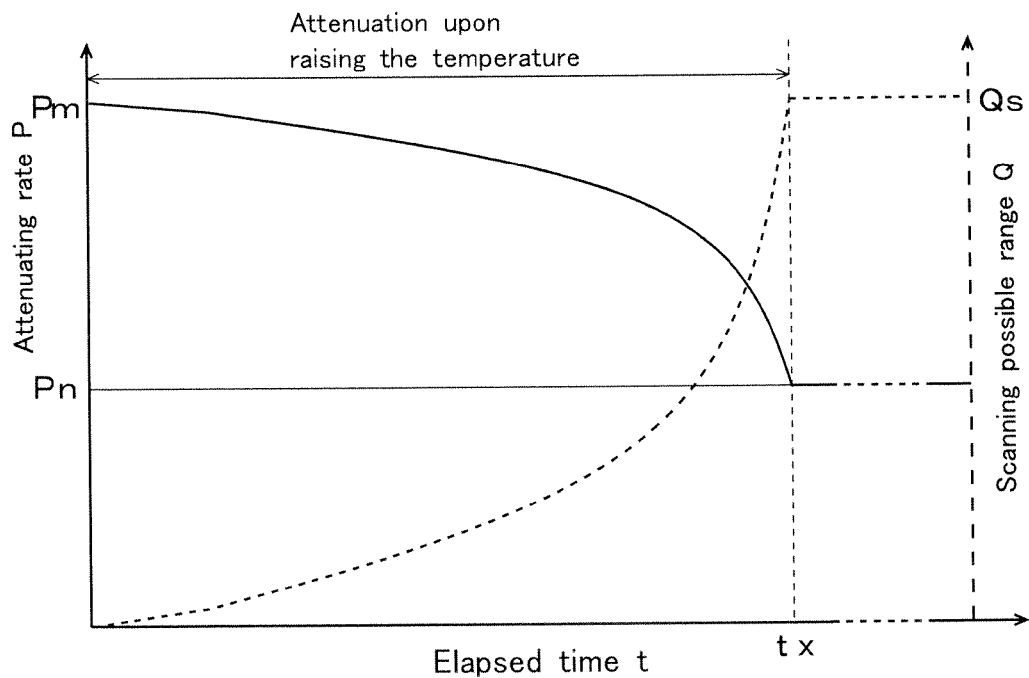
FIG. 15 is a view describing the time course of the attenuation rate P of the attenuation element and the scanning possible range Q of the MEMS mirror in the embodiment and is an explanatory view when the attenuation rate P is attenuated.

FIG. 14 is a view showing a time course (solid line in FIG. 14) of a damage risk factor R of the screen 40 with respect to the elapsed time t and a time course (dotted line in FIG. 14) of the scanning possible range Q of the MEMS mirror 70 with respect to the elapsed time t. The damage risk factor R of the screen 40 varies with the scanning possible range Q of the MEMS mirror 70. The screen 40 is likely to be burned (the damage risk factor R increases) as the scanning possible range Q of the MEMS mirror 70 is narrowed, and the screen 40 is unlikely to be burned (damage risk factor R is reduced) as the scanning possible range Q of the MEMS mirror 70 is widened. Specifically, the damage risk factor R has an inverse proportional relationship to the scanning possible range Q of the MEMS mirror 70. Therefore, as shown in FIG. 15, the attenuating rate P of the attenuation element 22 may be controlled to be gradually decreased in a manner in which the attenuating rate P is inversely proportional to the increase (reduction of the damage risk factor R) in the scanning possible range Q.

Further, if the attenuation element 22 is disposed in the LDs 11, 12, and 13 respectively and the self-heating drive range is different in each LD, only attenuation element to be paired with the LD performing the self-heating drive may perform the attenuation when raising the temperature.

In the head-up display device for vehicles 1 of the invention, the temperature detection is performed by the temperature detection unit 18 as described above and the control whether or not the LDs 11, 12, and 13 perform the self-heating drive in under a low temperature environment is performed at the time of starting of the head-up display device for vehicles 1. The head-up display device for vehicles 1 is started by ON of a start switch (ignition (hereinafter, IGN), accessories (hereinafter ACC), or key unlocking) of the vehicle and the detected temperature T is detected at the temperature detection unit 18, and the temperature rising control is performed based on the detected temperature T if necessary. In the CPU 401, when the normal driving of the LDs 11, 12, and 13 is started thereafter, the temperature rising control is performed in the Peltier element 16 and the Peltier element 16 is driven so that the detected temperature T does not become a second threshold value T2 or less, and it is preferable that the self-heating drive be not performed by stopping the normal driving of the LDs 11, 12 and 13. By such a configuration, when the head-up display device for vehicles 1 displays the display image M, it is possible to prevent the LDs 11, 12, and 13 from displaying unexpected (due to self-heating drive) display to the vehicle driver due to the self-heating drive.

Further, instead the LDs 11, 12, and 13 perform the self-heating drive until the detected temperature T detected by the temperature detection unit 18 exceeds the first threshold value, the self-heating drive may be performed for a predetermined time and then the normal driving may be performed.

Further, when the light intensity that is detected by the color sensor 20 or the photo diode 50 reaches a predetermined value, it may be assumed that the LDs 11, 12, and 13 are heated and the self-heating drive may be stopped.

Moreover, a laser-resistant member that is a ultra-high temperature resistant material such as a heat-resistant superalloy or ceramic on the screen 40 of the scanning region of the MEMS mirror 30 may be further included and the MEMS mirror driving means 201 may irradiate the combined laser light RGB on the laser-resistant member by the MEMS mirror 30 while the LDs 11, 12, and 13 perform the self-heating drive. It is possible to prevent burning and breakage of the screen 40 by such a configuration and specifically, it is possible to not irradiate the unnecessary display light L to the outside by providing the laser-resistant member in the non-display area 40b of the screen 40 and by irradiating the combined laser light RGB onto the laser-resistant member during the self-heating drive without adjusting the concave mirror 70 in the invisible position. Further, the laser-resistant members may be provided in a plurality of portions on the screen 40 of the scanning region of the MEMS mirror 30 and the laser-resistant members on which the combined laser light RGB is irradiated may be switched at a predetermined cycle.

INDUSTRIAL APPLICABILITY

The invention relates to the display device for a vehicle and, for example, can be applied to a display device for a vehicle information display that is mounted on a mobile body such as an automobile and projects the display image on the windshield of the vehicle to display the virtual image.

REFERENCE SIGNS LIST

1 head-up display device for vehicles (display device for vehicle)
10 combined laser light output unit
11 red LD (laser light source)
12 green LD (laser light source)
13 blue LD (laser light source)
14 condensing optical system
15 multiplexing means
16 Peltier element (auxiliary heating means)
17 heat sink
18 temperature detection means
20 color sensor (first light intensity detection means)
30 MEMS mirror (scanning unit)
40 screen
50 photo diode (second light intensity detection means)
60 plane mirror
70 concave mirror (reflection means)
80 housing
90 light-transmitting unit
100 LD control unit
101 LD driving means (light source driving means)
102 LD current detection means
103 LD power supply means
200 scan control unit
201 MEMS mirror driving means (scanning unit driving means)
202 mirror position detection means
300 reflection means movement control unit (angle adjusting means)
301 motor
302 motor drive unit
303 concave mirror state detection unit
400 general control unit
401 CPU
402 recording means

The invention claimed is:

1. A display device comprising:
a housing, including a transmission portion through which light can transmit;
a laser, configured to emit laser light for a display image;
a screen;
a scanning mirror, configured to receive the laser light and scan it as the display image onto the screen;
one or more mirrors, configured to reflect the display image towards the transmission portion of the housing,
a temperature sensor, configured to detect a temperature of the laser, wherein the laser is configured to perform self-heating when the detected temperature is below a first threshold value and is configured to emit laser light for the display image when the detected temperature is above a second threshold value, wherein the second threshold value is higher than the first threshold value;
an auxiliary heater, configured to heat the laser when the detected temperature is between the first threshold value and a third threshold value, wherein the third threshold value is higher than the second threshold value.

2. The display device according to claim 1,
wherein the scanning mirror is configured to scan laser light a predetermined cycle while the laser performs self-heating.

3. The display device for a vehicle according to claim 1,
wherein the laser performs self-heating by flowing direct current in the laser.

4. The display device according to claim 1, further comprising:
a motor configured to adjust an angle of one of the one or more mirrors,
wherein the motor is configured to adjust the mirror angle so that the display image is not reflected towards the transmission portion of the housing, while the laser performs self-heating.

5. The display device according to claim 1,
wherein the scanning mirror is configured to scan laser light on a non-display area of the screen.

6. The display device according to claim 1,
wherein the auxiliary heater is a Peltier element.

7. The display device according to claim 1, wherein the laser is configured to operate with gradually decreasing power based on an increase in the detected temperature.

8. The display device according to claim 1, further comprising:
a laser-resistant material on a display area of the screen,
wherein the scanning mirror is configured to scan laser light onto the laser-resistant material while the laser performs self-heating.

9. The display device according to claim 1, further comprising:
a variable attenuator disposed in an optical path between the laser and the scanning mirror and capable of attenuating the laser light; and
wherein the variable attenuator attenuates the laser light while the laser performs self-heating.

10. The display device for a vehicle according to claim 9,
wherein the variable attenuator includes a liquid crystal element and a polarizing filter, and
wherein the liquid crystal element has a normally black characteristic.

\* \* \* \* \*